United States Patent
Rahman et al.

(10) Patent No.: US 11,616,192 B2
(45) Date of Patent: Mar. 28, 2023

(54) MAGNETIC MEMORY DEVICES WITH A TRANSITION METAL DOPANT AT AN INTERFACE OF FREE MAGNETIC LAYERS AND METHODS OF FABRICATION

(71) Applicant: Intel Corporation, Santa Clara, CA (US)

(72) Inventors: Tofizur Rahman, Portland, OR (US); Christopher J. Wiegand, Portland, OR (US); Justin S. Brockman, Portland, OR (US); Daniel G. Ouellette, Portland, OR (US); Angeline K. Smith, Hillsboro, OR (US); Andrew Smith, Hillsboro, OR (US); Pedro A. Quintero, Beaverton, OR (US); Juan G. Alzate-Vinasco, Tigard, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1030 days.

(21) Appl. No.: 16/024,599

(22) Filed: Jun. 29, 2018

(65) Prior Publication Data

US 2020/0006635 A1 Jan. 2, 2020

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *H01L 27/226* (2013.01); *H01L 43/12* (2013.01); *H01L 43/10* (2013.01)

(58) Field of Classification Search
CPC ....... H01L 43/02; H01L 27/226; H01L 43/12; H01L 43/10; G11C 11/161
(Continued)

(56) References Cited

U.S. PATENT DOCUMENTS 6,965,138 B2 11/2005 Nakajima et al.
7,098,495 B2 8/2006 Sun et al.
(Continued)

FOREIGN PATENT DOCUMENTS

| WO | 2016209272 | 12/2016 |
| WO | 2017052606 | 3/2017 |
| WO | 2017135767 | 8/2017 |

OTHER PUBLICATIONS

Extended European Search Report for European Patent Application No. 19176640.1 dated Oct. 30, 2019.
(Continued)

*Primary Examiner* — Jami Valentine Miller
(74) *Attorney, Agent, or Firm* — Essential Patents Group, LLP

(57) ABSTRACT

A memory device includes a perpendicular magnetic tunnel junction (pMTJ) stack, between a bottom electrode and a top electrode. In an embodiment, the pMTJ includes a fixed magnet, a tunnel barrier above the fixed magnet and a free magnet structure on the tunnel barrier. The free magnet structure includes a first free magnet on the tunnel barrier and a second free magnet above the first free magnet, wherein at least a portion of the free magnet proximal to an interface with the free magnet includes a transition metal. The free magnet structure having a transition metal between the first and the second free magnets advantageously improves the switching efficiency of the MTJ, while maintaining a thermal stability of at least 50 kT.

12 Claims, 11 Drawing Sheets

(51) Int. Cl.
 *H01L 27/22* (2006.01)
 *H01L 43/12* (2006.01)
 *H01L 43/10* (2006.01)

(58) Field of Classification Search
 USPC .......................................................... 257/421
 See application file for complete search history.

(56) References Cited

U.S. PATENT DOCUMENTS

| | | | |
|---|---|---|---|
| 7,538,402 | B2 | 5/2009 | Fukumoto |
| 8,018,011 | B2 | 9/2011 | Ranjan et al. |
| 8,159,870 | B2 | 4/2012 | Xia |
| 8,169,821 | B1 | 5/2012 | Ranjan et al. |
| 8,476,722 | B2 | 7/2013 | Lee |
| 10,453,510 | B2 | 10/2019 | Park et al. |
| 10,749,104 | B2 | 8/2020 | Liu et al. |
| 2004/0211963 | A1 | 10/2004 | Garni et al. |
| 2005/0247964 | A1 | 11/2005 | Pietambaram et al. |
| 2007/0063237 | A1* | 3/2007 | Huai ................... G11B 5/3983 257/295 |
| 2007/0183187 | A1 | 8/2007 | Guo |
| 2012/0126905 | A1 | 5/2012 | Zhang et al. |
| 2012/0163070 | A1 | 6/2012 | Nagase et al. |
| 2013/0001506 | A1 | 1/2013 | Sato et al. |
| 2013/0001652 | A1 | 1/2013 | Yoshikawa et al. |
| 2013/0099780 | A1 | 4/2013 | Ma et al. |
| 2013/0299929 | A1 | 11/2013 | Watanabe et al. |
| 2013/0336045 | A1 | 12/2013 | Kuo et al. |
| 2014/0021426 | A1 | 1/2014 | Lee et al. |
| 2014/0084398 | A1 | 3/2014 | Oguz et al. |
| 2014/0084938 | A1 | 3/2014 | Lai et al. |
| 2014/0145792 | A1 | 5/2014 | Wang et al. |
| 2014/0175582 | A1 | 6/2014 | Apalkov et al. |
| 2014/0269035 | A1 | 9/2014 | Manipatruni et al. |
| 2014/0306302 | A1 | 10/2014 | Guenole et al. |
| 2015/0035095 | A1 | 2/2015 | Kim et al. |
| 2015/0061020 | A1 | 3/2015 | Yokoyama et al. |
| 2015/0076633 | A1 | 3/2015 | Siddik et al. |
| 2015/0171316 | A1 | 6/2015 | Park et al. |
| 2016/0155932 | A1 | 6/2016 | Chen et al. |
| 2017/0148978 | A1 | 5/2017 | Apalkov et al. |
| 2018/0066375 | A1 | 3/2018 | Morgan et al. |
| 2018/0076384 | A1 | 3/2018 | Gan et al. |
| 2018/0114898 | A1 | 4/2018 | Lee |
| 2018/0123027 | A1 | 5/2018 | Yamane et al. |
| 2018/0123028 | A1 | 5/2018 | Shiokawa et al. |
| 2018/0130943 | A1 | 5/2018 | Naik et al. |
| 2018/0175286 | A1 | 6/2018 | Sato et al. |
| 2018/0219152 | A1 | 8/2018 | Apalkov et al. |
| 2018/0233187 | A1 | 8/2018 | Lim et al. |
| 2018/0240970 | A1 | 8/2018 | Oguz et al. |
| 2018/0248113 | A1 | 8/2018 | Pinarbasi et al. |
| 2018/0248114 | A1 | 8/2018 | Oguz et al. |
| 2018/0248115 | A1* | 8/2018 | Oguz ....................... H01L 43/08 |
| 2018/0358065 | A1 | 12/2018 | Hu et al. |
| 2019/0006414 | A1 | 1/2019 | Huai et al. |
| 2019/0043548 | A1 | 2/2019 | Park et al. |
| 2019/0079701 | A1 | 3/2019 | Rakshit et al. |
| 2019/0165253 | A1 | 5/2019 | Sun et al. |
| 2019/0252601 | A1 | 8/2019 | Chatterjee et al. |
| 2019/0272863 | A1 | 9/2019 | Jung et al. |
| 2019/0304524 | A1 | 10/2019 | Oguz et al. |
| 2019/0304525 | A1 | 10/2019 | Manipatruni et al. |
| 2019/0305212 | A1 | 10/2019 | Gosavi et al. |
| 2019/0305216 | A1 | 10/2019 | Gosavi et al. |
| 2019/0305217 | A1 | 10/2019 | Xue et al. |
| 2019/0326353 | A1 | 10/2019 | O'Brien et al. |
| 2019/0386205 | A1 | 12/2019 | Gosavi et al. |
| 2019/0386209 | A1 | 12/2019 | Smith et al. |
| 2019/0386662 | A1 | 12/2019 | Lin et al. |
| 2020/0006628 | A1 | 1/2020 | O'Brien et al. |
| 2020/0035282 | A1 | 1/2020 | Lee et al. |
| 2020/0083286 | A1 | 3/2020 | Manipatruni et al. |
| 2020/0083427 | A1 | 3/2020 | Manipatruni et al. |
| 2020/0098410 | A1 | 3/2020 | Gosavi et al. |
| 2020/0105998 | A1 | 4/2020 | Smith et al. |
| 2020/0227104 | A1 | 7/2020 | Rahman et al. |
| 2020/0273864 | A1 | 8/2020 | Manipatruni et al. |
| 2020/0273866 | A1 | 8/2020 | Manipatruni et al. |
| 2020/0273867 | A1 | 8/2020 | Manipatruni et al. |
| 2020/0303343 | A1 | 9/2020 | Manipatruni et al. |
| 2020/0303344 | A1 | 9/2020 | Manipatruni et al. |
| 2020/0312907 | A1 | 10/2020 | Ouellette et al. |
| 2020/0313084 | A1 | 10/2020 | Ouellette et al. |
| 2020/0321344 | A1 | 10/2020 | Ramamoorthy et al. |
| 2020/0321472 | A1 | 10/2020 | Ramamoorthy et al. |
| 2020/0321473 | A1 | 10/2020 | Ramamoorthy et al. |
| 2020/0321474 | A1 | 10/2020 | Ramamoorthy et al. |
| 2021/0012940 | A1 | 1/2021 | Salahuddin et al. |
| 2021/0202507 | A1 | 7/2021 | Thareja et al. |
| 2021/0202510 | A1 | 7/2021 | Thareja et al. |
| 2021/0202689 | A1 | 7/2021 | Thareja et al. |
| 2021/0202690 | A1 | 7/2021 | Thareja et al. |
| 2021/0203324 | A1 | 7/2021 | Manipatruni et al. |
| 2021/0203325 | A1 | 7/2021 | Manipatruni et al. |
| 2021/0203326 | A1 | 7/2021 | Manipatruni et al. |
| 2021/0226636 | A1 | 7/2021 | Manipatruni et al. |

OTHER PUBLICATIONS

Notice of Allowance from European Patent Application No. 19176640.1 dated Nov. 24, 2020, 7 pgs.
Liu, Luqiao, et al., "Spin Hall effect tunneling spectroscopy", Nature Physics, vol. 10, Aug. 2014, 6 pgs.
Liu, Luqiao, et al., "Spin-polarized tunneling study of spin-momentum locking in topological insulators", Physical Review B 91, 235437, 2015, 10 pgs.

* cited by examiner

MAGNETIC MEMORY DEVICES WITH A TRANSITION METAL DOPANT AT AN INTERFACE OF FREE MAGNETIC LAYERS AND METHODS OF FABRICATION

BACKGROUND

The past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile embedded memory device with perpendicular magnetic tunnel junction (pMTJ), e.g., on-chip embedded memory with non-volatility can enable energy and computational efficiency. However, the technical challenges of assembling a pMTJ stack to form functional memory devices presents formidable roadblocks to commercialization of this technology today. Specifically, increasing thermal stability of pMTJ along with increasing switching efficiency are some of the challenges in assembling a viable pMTJ stack.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
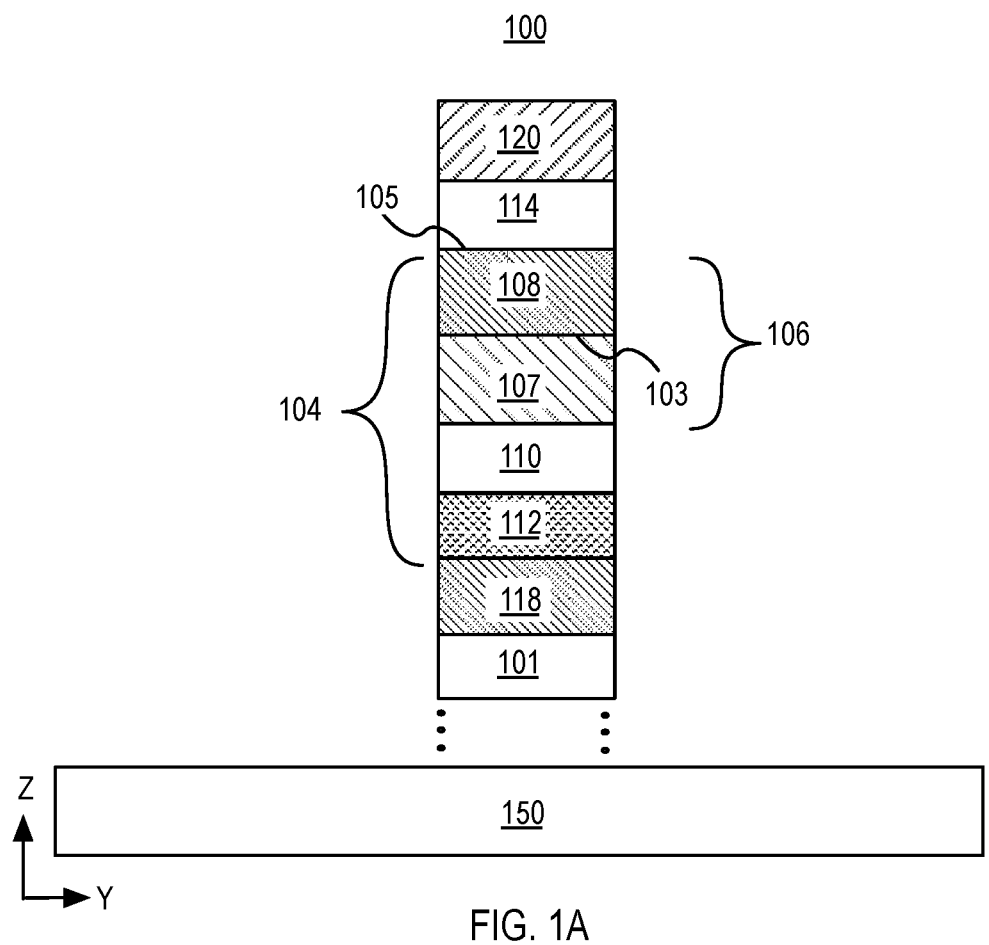
FIG. 1A illustrates a cross-sectional view of a memory device, in accordance with an embodiment of the present disclosure.

Perpendicular-MTJ (pMTJ) devices with enhanced stability and high switching efficiency and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as transistor operations and switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

A MTJ device functions as a variable resistor where the resistance of the device may switch between a high resistance state and a low resistance state. The resistance state of a MTJ device is defined by the relative orientation of magnetization of two magnetic layers (fixed and free) that are separated by a tunnel barrier. When the magnetization of the two magnetic layers have orientations that are in the same direction the MTJ device is said to be in a low resistance state. Conversely, when the magnetization of the two magnetic layers have orientations that are in opposite directions the MTJ device is said to be in a high resistance state. In an embodiment, resistance switching is brought about by passing a critical amount of spin polarized current or switching current through the MTJ device so as to influence the direction of magnetization of the free magnetic layer to align with the magnetization of the fixed magnetic layer. Such an alignment may be brought about by a torque exerted by the spin polarized current on the magnetization of the free magnetic layer. By changing the direction of the current, the direction of magnetization in the free magnetic layer may be reversed relative to that of the fixed magnetic layer. Since the free magnetic layer does not need power to retain relative orientation of magnetization, the resistance state of the MTJ device is retained even when there is no power applied to the MTJ device. For this reason, MTJ belongs to a class of memory known as non-volatile memory.

Integrating a non-volatile memory device such as a MTJ device onto an access transistor enables the formation of embedded memory for system on chip or for other applications.

However, approaches to integrate a MTJ device onto an access transistor presents challenges that have become far more formidable with scaling. Examples of such challenges range from improving thermal stability of MTJ devices against perturbing forces, reducing switching current and enabling patterning of MTJ devices at less than 40 nm feature sizes. As scaling continues, the need for smaller memory devices to fit into a scaled cell size has driven the industry in the direction of "perpendicular" MTJ or pMTJ. pMTJ based memory devices have a fixed magnet and a free magnet each having a magnetic anisotropy that is perpendicular with respect to a horizontal plane of the free magnet. Fortunately, while pMTJ devices have higher stability for small memory device sizes, maintaining stability along with improving other device parameters such as switching efficiency continues to be a challenge.

A free magnet in pMTJ device may include a multilayer stack having a layer of non-magnetic material between a pair of layers including magnetic materials to increase thermal stability and improve retention characteristics for functionality as a memory device. Multiple layers of magnetic materials separated by a layer of non-magnet may be dipole coupled and where the dipole coupled layers of magnetic materials undergo magnetization switching simultaneously. To an extent, thermal stability of a pMTJ device depends on the strength of the perpendicular anisotropy of the free magnetic layers in the pMTJ material layer stack. Strength of perpendicular anisotropy depends on the quality and size (volume) of the free magnets, to an extent on the number and quality of interfaces between magnetic and non-magnetic layers and on a parameter such as a thickness of the nonmagnetic layer. While a thick non-magnetic layer may be used to increase perpendicular interfacial anisotropy and thermal stability, another magnetic parameter such as switching efficiency may become diminished. The switching efficiency of a free magnet may be defined as the ratio between thermal activation barrier height, $E_b$, in free magnetic layer and the threshold switching current, $I_{c0}$. A thick non-magnetic layer may be any non-magnetic layer that is substantially equal to, or thicker than, 0.2 nm.

In accordance with embodiments of the present disclosure, the switching efficiency may be increased by thinning the non-magnetic layer below 0.2 nm. By thinning the non-magnetic layer, a parameter known as magnetic damping may be reduced as the non-magnetic layer becomes discontinuous. Magnetic damping acts against the spin transfer torque in the free magnets and causes an increase in the switching current and a reduction in switching efficiency.

In accordance with embodiments of the present disclosure, a memory device includes a perpendicular magnetic tunnel junction (pMTJ) stack, between a bottom electrode and a top electrode. In an embodiment, the pMTJ includes a fixed magnet, a tunnel barrier above the fixed magnet and a free magnet structure on the tunnel barrier. The free magnet structure includes a first free magnet on the tunnel barrier and a second free magnet above the first free magnet, wherein at least a portion of the free magnet proximal to an interface with the free magnet includes a transition metal. The free magnet structure having a transition metal between the first and the second free magnet may advantageously improve the switching efficiency of the pMTJ, while maintaining a thermal stability (e.g., of at least 50 kT). In some embodiments, the transition metal includes at least one of tungsten, hafnium, tantalum or molybdenum. In other embodiments, the free magnet structure includes a coupling layer that includes the transition metal, where the coupling layer is at most 0.1 nm thick. Such a layer may be sufficiently thin to effectively reduce damping, but sufficiently thick to preserve interfacial perpendicular anisotropy in each of the interfaces between the coupling layer and the first free magnet, and between the coupling layer and the second free magnet. A coupling layer having a thickness of 0.1 nm may be discontinuous over some portions between the first and the second free magnets, enabling portions of the first and second free magnets in one or more discontinuities to be in direct contact with each other. However, the discontinuities may not be so prevalent or substantial, so as to prevent dipole coupling between the first and second free magnets (as might occur for significantly thicker coupling layers).

FIG. 1A is an illustration of a cross-sectional view of a memory device 100 in accordance with an embodiment of the present disclosure. The memory device 100 includes a bottom electrode 101, a top electrode 120, and a magnetic tunnel junction (MTJ) 104 between the bottom electrode 101 and the top electrode 120. The MTJ 104 includes a fixed magnet 112 above the bottom electrode 101, a free magnet structure 106 above the fixed magnet 112 and a tunnel barrier 110 between the fixed magnet 112 and the free magnet structure 106. In an exemplary embodiment, as disclosed herein, the magnetic tunnel junction (MTJ) 104 is a perpendicular MTJ (pMTJ). In some such embodiment, the free magnet structure 106 and fixed magnet 112 of the pMTJ 104 have perpendicular magnetic anisotropy. The free magnet structure 106 advantageously improves the switching efficiency of the pMTJ 104, while maintaining a thermal stability of at least 50 kT. The free magnet structure 106 includes a first free magnet 107 on the tunnel barrier 110, and a second free magnet 108 on the first free magnet 107, wherein at least a portion of the free magnet 107 proximal to an interface 103 with the free magnet 108 includes a transition metal. In some embodiments, the transition metal includes at least one of tungsten, hafnium, tantalum or molybdenum.

In some embodiments, the pMTJ 104 further includes a coupling layer 109 between the free magnet 107 and the free magnet 108. In the illustrative embodiment, the coupling layer 109 couples the free magnet 107 to free magnet 108 via dipole coupling.

Figure 1B:
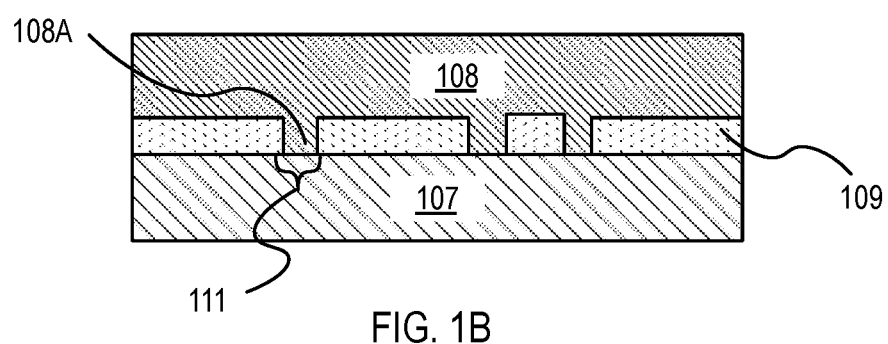
FIG. 1B illustrates an enhanced cross-sectional view of a free magnet structure, depicting discontinuities in a coupling layer between two free magnetic layers, in accordance with an embodiment of the present disclosure.

In some embodiments, the coupling layer 109 has a thickness that is no more than 0.1 nm and includes the transition metal. In some embodiments, a coupling layer 109 having a thickness less than 0.1 nm is discontinuous, as illustrated in FIG. 1B. When there are discontinuities in the coupling layer, at least a portion of the free magnet 108 is in direct contact with the free magnet 107, in at least one discontinuity 111 or in a plurality of discontinuities in the coupling layer 109 as shown in FIG. 1B. In the illustrative embodiment, at least one discontinuity 111 is filled with free magnet portion 108A.

In an embodiment, the free magnet 107 has a thickness between 0.5 nm and 2.0 nm for pMTJ devices. In an embodiment, the free magnet 108 has a thickness between 0.0.4 nm and 1.5 nm for pMTJ devices. In an embodiment, the free magnet 107 has a thickness that is greater than a thickness of the free magnet 108. In such an embodiment, the free magnet structure 106 has a combined total thickness that is less than 3 nm. A combined total thickness of less than 3 nm can be sufficient to maintain perpendicular magnetic anisotropy in the free magnet structure 106.

Referring again to FIG. 1A, in an exemplary embodiment, the free magnet 107 has a first perpendicular magnetic anisotropy and the free magnet 108 has a second perpendicular magnetic anisotropy. In some embodiments, the first perpendicular magnetic anisotropy is greater than the second perpendicular magnetic anisotropy. In other embodiments, the first perpendicular magnetic anisotropy is substantially similar to the second perpendicular magnetic anisotropy. In yet another embodiment, the second perpendicular magnetic anisotropy is greater than the first perpendicular magnetic anisotropy.

The pMTJ 104 further includes a cap 114 between the free magnet structure 106 and the top electrode 120. In the illustrative embodiment, the cap 114 is on the side of the free magnet structure 106 that is opposite to the tunnel barrier 110. The cap 114 may be a non-metal such as an oxide. In embodiments, cap 114 is a oxide that includes a metal and oxygen, for instance $In_2O_{3-x}$, $VO_2$, $V_2O_3$, $WO_2$, RuO, AlOx or MgO. In other examples, the cap 114 is a doped conductive oxide such as Sn-doped $In_2O_3$ (ITO), In- or Ga-doped ZnO or metal doped MgO. In an embodiment, the cap 114 has a thickness of at least 1.5 nm. In an embodiment, when the free magnet 108 includes iron, the cap 114 is source of oxygen that enables oxygen-iron hybridization at an interface 105 located between an uppermost surface of the free magnet 108 and a lowermost surface of the cap 114. The oxygen-iron hybridization in the interface 105 enables interfacial perpendicular anisotropy in the free magnet structure 106.

In an embodiment, tunnel barrier 110 is composed of a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 112 below the tunnel barrier 110 and free magnet 107 above tunnel barrier 110. In an embodiment, a free magnet 107 including a $Co_{100-x-y}Fe_xB_y$, is highly lattice matched to the tunnel barrier 110 including an MgO. Lattice matching a crystal structure of the free magnet 107 with the tunnel barrier 110 enables a higher tunneling magnetoresistance (TMR) ratio in the pMTJ 104. In an embodiment, tunnel barrier 110 is MgO and has a thickness in the range of 1 nm to 2 nm.

In an embodiment, the fixed magnet 112 includes magnetic materials with sufficient perpendicular magnetization. In an embodiment, the fixed magnet 112 of the pMTJ 104 can include alloys such as CoFe, CoFeB, FeB. The alloys of CoFe, CoFeB, FeB may include doping of tungsten, tantalum, or molybdenum to promote high perpendicular anisotropy. Alternatively, the alloys of CoFe, CoFeB, FeB may include thin inserts of W, Ta or Molybdenum to promote high perpendicular anisotropy. In an embodiment, the fixed magnet 112 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 112 is FeB, where the concentration of boron is between 10-40 atomic percent of the total composition of the FeB alloy. In further embodiments, there are additional layers of high-anisotropy CoPt or CoNi or CoPd multilayers and/or alloys to provide a further perpendicular anisotropy boost to the alloys of two or more of Co, Fe, B. In an embodiment the fixed magnet 112 has a thickness that is between 1 nm and 3 nm.

Figure 1C:
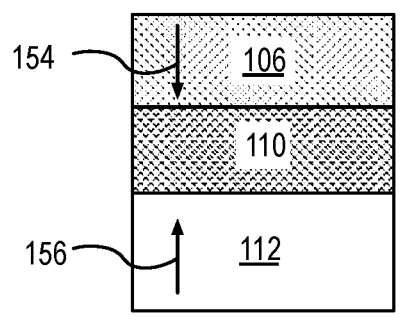
FIG. 1C illustrates a cross-sectional view depicting the direction of magnetization in a free magnet relative to the direction of magnetization in a fixed magnetic layer, in accordance with an embodiment of the present disclosure.

FIG. 1C illustrates a cross-sectional view depicting the free magnet structure 106 of the pMTJ 104 having a direction of magnetization (denoted by the direction of the arrow 154) that is anti-parallel to a direction of magnetization (denoted by the direction of the arrow 156) in the fixed magnet 112. When the direction of magnetization 154 in the free magnet structure 106 is opposite (anti-parallel) to the direction of magnetization 156 in the fixed magnet 112, the pMTJ 104 device is said to be in a high resistance state.

Figure 1D:
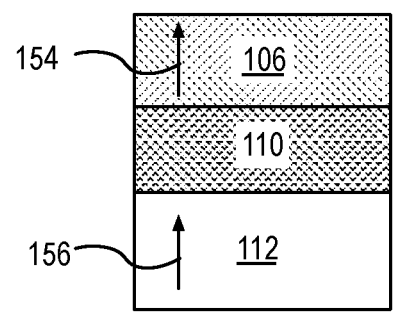
FIG. 1D illustrates a cross-sectional view depicting the direction of magnetization in a free magnet relative to the direction of magnetization in a fixed magnetic layer, in accordance with an embodiment of the present disclosure.

Conversely, FIG. 1D illustrates a cross-sectional view depicting the free magnet structure 106 of the pMTJ 104 having a direction of magnetization (denoted by the direction of the arrow 154) that is parallel to a direction of magnetization (denoted by the direction of the arrow 156) in the fixed magnet 112. When the direction of magnetization 154 in the free magnet structure 106 is parallel to the direction of magnetization 156 in the fixed magnet 112, the pMTJ 104 is said to be in a low resistance state.

In an embodiment, the free magnet structure 106 and the fixed magnet 112 can have approximately similar thicknesses and an injected spin polarized current which changes the direction of the magnetization 154 in the free magnet structure 106 can also affect the magnetization 156 of the fixed magnet 112. In an embodiment, to make the fixed magnet 112 more resistant to accidental flipping the fixed magnet 112 has a higher magnetic anisotropy than the free magnet structure 106. In another embodiment, as illustrated in FIG. 1A, memory device 100 includes a synthetic anti-ferromagnetic (SAF) structure 118 between the bottom electrode 101 and the fixed magnet 112. A SAF structure 118 may minimize stray magnetic field impinging on the free layer 108 and may prevent an accidental change in the direction of magnetization 156 in the fixed magnet 112.

Figure 1E:
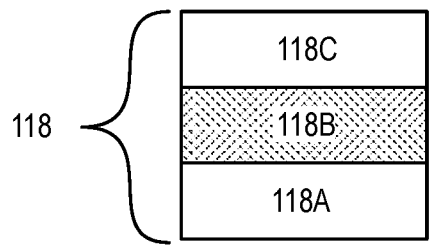
FIG. 1E illustrates a cross-sectional view of individual layers of a synthetic antiferromagnetic structure, in accordance with an embodiment of the present disclosure.

FIG. 1E illustrates cross-sectional view of the SAF structure 118 in an accordance of an embodiment of the present disclosure. In an embodiment, the SAF structure 118 includes a non-magnetic layer 118B sandwiched between a first pinning ferromagnet 118A and a second pinning ferromagnet 118C as depicted in FIG. 1D. The first pinning ferromagnet 118A and the second pinning ferromagnet 118C are anti-ferromagnetically coupled to each other. In an embodiment, the first pinning ferromagnet 118A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 118B includes a ruthenium or an iridium layer. In an embodiment, the second pinning ferromagnet 118C includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, a ruthenium based non-magnetic layer 118B has a thickness between 0.3 nm and 1.0 nm to ensure that the coupling between the first pinning ferromagnet 118A and the second pinning ferromagnet 118C is anti-ferromagnetic in nature.

It is to be appreciated that an additional layer of non-magnetic spacer layer may exist between the fixed magnet 112 and the SAF structure 118 (not illustrated in FIG. 1A). A non-magnetic spacer layer enables coupling between the SAF structure 118 and the fixed magnet 116. In an embodiment, a non-magnetic spacer layer may include a metal such as Ta, Ru or Ir.

Referring again to FIG. 1A, in an embodiment, the top electrode 120 includes a material such as Ta or TiN. In an embodiment, the top electrode 120 has a thickness between 5 nm and 70 nm. In some embodiments, the bottom electrode 101 includes one or more layers including materials such as but not limited to TaN, Ru or TiN.

In an embodiment, the substrate 150 includes a suitable semiconductor material such as but not limited to, single crystal silicon, polycrystalline silicon and silicon on insulator (SOI). In another embodiment, substrate 150 includes other semiconductor materials such as germanium, silicon germanium or a suitable group III-N or a group III-V compound. Logic devices such as MOSFET transistors and access transistors and may be formed on the substrate 150. Logic devices such as access transistors may be integrated with memory devices such as SOT memory devices to form embedded memory. Embedded memory including SOT memory devices and logic MOSFET transistors can be combined to form functional integrated circuit such as a system on chip.

Figure 2:
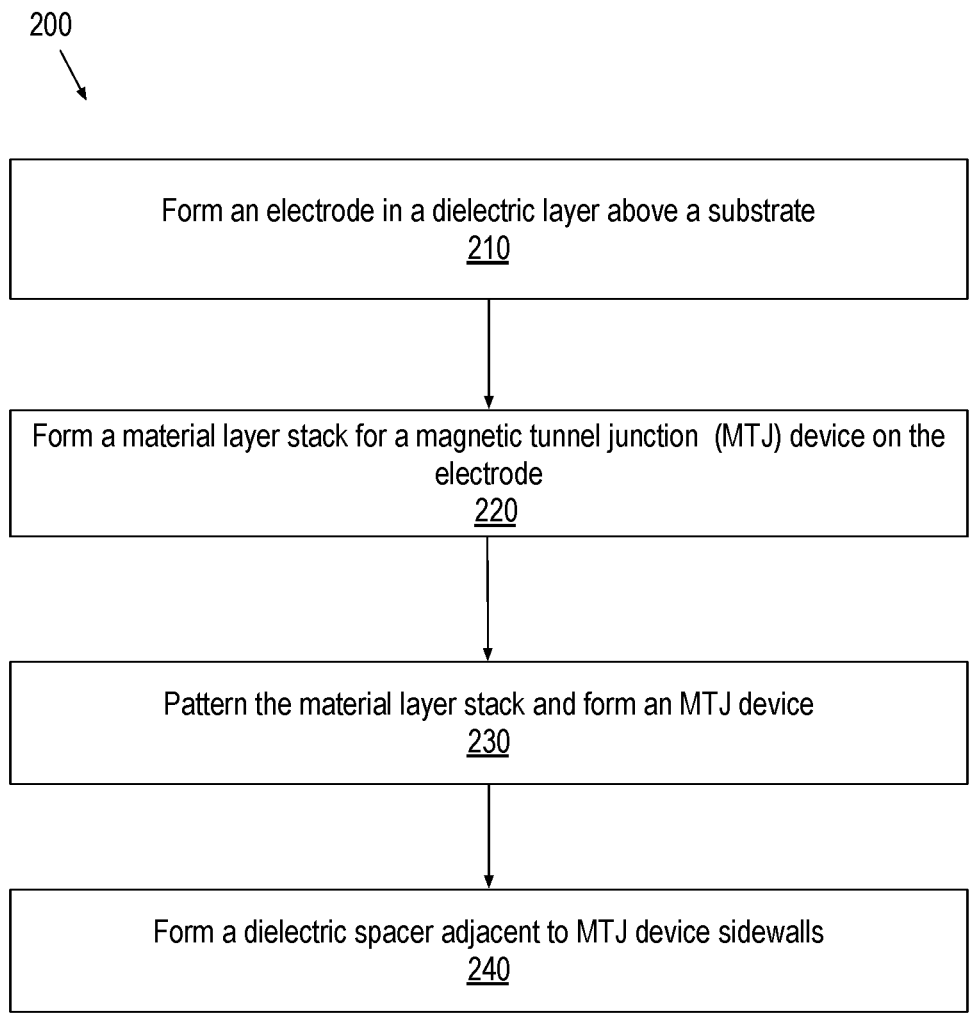
FIG. 2 illustrates a flow diagram of a method to fabricate a memory device.

FIG. 2 illustrates a flow diagram of a method to fabricate a memory device. The method 200 begins at operation 210 by forming a first electrode in a dielectric layer above a substrate. The method 200 continues at operation 220 with the formation of a pMTJ material layer stack on the bottom electrode. In exemplary embodiments, all layers in the pMTJ material layer stack are blanket deposited in-situ without breaking vacuum. In a simplest embodiment, forming the pMTJ material layer stack includes deposition of a SAF layer on the bottom electrode, deposition of a fixed magnetic layer on the SAF layer, deposition of a tunnel barrier on the fixed magnetic layer, deposition of a first free magnetic layer on the tunnel barrier, deposition of a coupling layer on the second free magnetic layer, deposition of a second free magnetic layer on the coupling layer and deposition of a capping layer on the second free magnetic layer. The method 200 is continued at operation 240 with patterning of the pMTJ material layer stack to form a memory device. The method 200 is then resumed at operation 240 with the deposition of dielectric spacer and patterning to form a dielectric spacer adjacent to sidewalls of the memory device.

FIGS. 3A-5B illustrate cross-sectional views representing various operations in a method of fabricating a memory device, such as the memory device 100 in accordance with embodiments of the present disclosure.

Figure 3A:
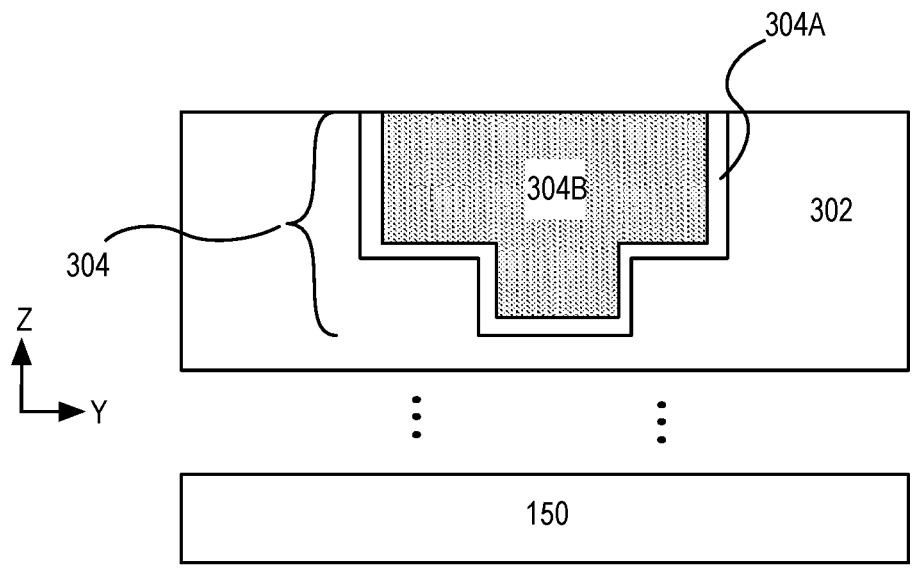
FIG. 3A illustrates a conductive interconnect formed above a substrate.

FIG. 3A illustrates a conductive interconnect 304 formed above a substrate 150. In some embodiments, the conductive interconnect 304 is formed in a dielectric layer 302, above a substrate, such as is shown. In an embodiment, the conductive interconnects 304 includes a barrier layer 304A and a fill metal 304B. In some examples, the barrier layer 304A includes a material such as tantalum nitride or ruthenium. In some examples, the fill metal 304B includes a material such as copper or tungsten. In other examples, the conductive interconnect 304 is fabricated using a subtractive etch process when materials other than copper are utilized. In an embodiment, the dielectric layer 302 includes a material such as but not limited to silicon dioxide, silicon nitride, silicon carbide, or carbon doped silicon oxide. The dielectric layer 302 may have an uppermost surface that is substantially co-planar with an uppermost surface of the conductive interconnect 304, as is illustrated. In some embodiments, conductive interconnects 304 is electrically connected to a separate circuit element such as a transistor (not shown).

Figure 3B:
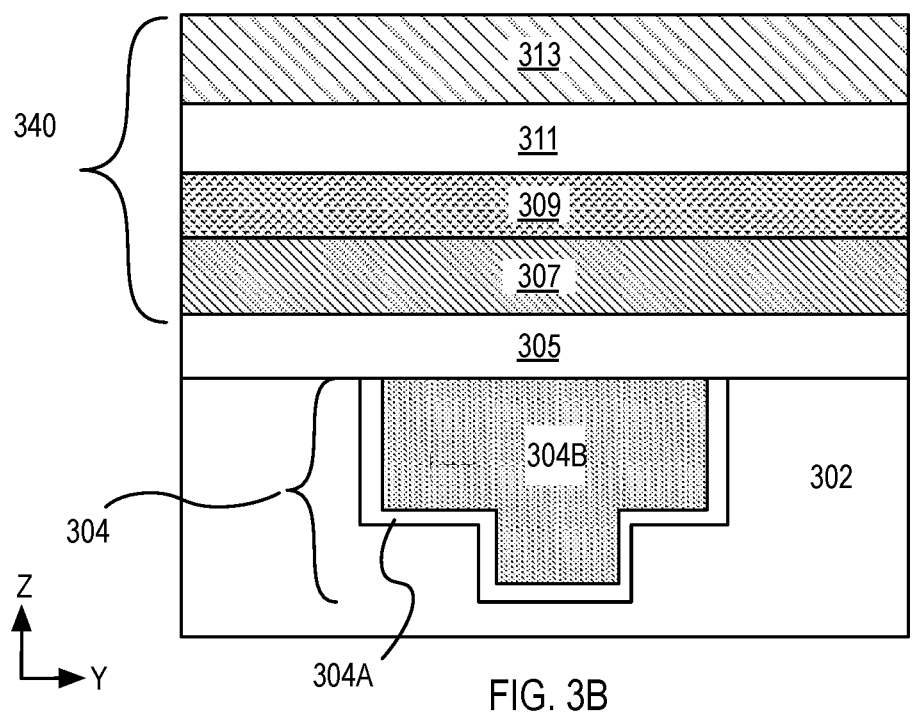
FIG. 3B illustrates the structure of FIG. 3A following the formation of a first conductive layer on the conductive interconnect followed by the formation of a plurality of layers of a pMTJ material layer stack.

FIG. 3B illustrates the structure of FIG. 3A following the formation of a conductive layer 305 on the conductive interconnect 304 followed by the formation of a plurality of layers of a pMTJ material layer stack 340. In an embodiment, the conductive layer 305 includes a material that is the same or substantially the same as the material of the bottom electrode 120.

In an embodiment, one or more SAF layers 307 that form a SAF structure are formed on the conductive layer 305. In some embodiments, one or more SAF layers 307 are blanket deposited on the conductive layer 305 using a PVD process. In some embodiments, the one or more SAF layers 307 utilized to form a SAF structure are the same or substantially the same as the one or more layers in the SAF structure 118, described above.

In an embodiment, a fixed magnetic layer 309 is deposited on the one or more SAF layers 307. The fixed magnetic layer 309 may be deposited using a PVD process or a plasma enhanced chemical vapor deposition process. In an embodiment, the fixed magnetic layer 309 includes a material that is the same or substantially the same as the material of the fixed magnet 112. In an embodiment, the deposition process forms a fixed magnetic layer 309 including CoFeB that is amorphous. In one example, fixed magnetic layer 309 is deposited to a thickness between 0.9 nm and 2.0 nm to fabricate a pMTJ. During an in-situ deposition process, a tunnel barrier layer 311 is then formed on the fixed magnetic layer 309, a first free magnetic layer 313 is formed on the tunnel barrier layer 311 to partially complete formation of a pMTJ material layer stack 340.

In some embodiments, a tunnel barrier layer 311 is blanket deposited on the fixed magnetic layer 309. In an embodiment, the tunnel barrier layer 311 is a material including magnesium and oxygen or a material including aluminum and oxygen. In an exemplary embodiment, the tunnel barrier layer 311 is a layer of MgO and is deposited using a reactive sputter process. In an embodiment, the reactive sputter process is carried out at room temperature. In an embodiment, the tunnel barrier layer 311 is deposited to a thickness between 0.8 nm to 1 nm. In some examples, the deposition process is carried out in a manner that yields a tunnel barrier layer 311 having an amorphous structure. In some such examples, the amorphous tunnel barrier layer 311 becomes crystalline after performing a high temperature anneal process to be described further below. In other embodiments, the tunnel barrier layer 311 is crystalline as deposited.

In an embodiment, a free magnetic layer 313 is blanket deposited on an uppermost surface of the tunnel barrier layer 311. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic layer 313 is $Co_{100-x-y}Fe_xB_y$, where X and Y each represent atomic percent, further where X is between 50-80 and Y is between 10-40, and further where the sum of X and Y is less than 100. In some embodiments, the free magnetic layer 313 includes a material that is the same or substantially the same as the material of the fixed magnet 116 described above. In some examples, the free magnetic layer 313 may be deposited to a thickness between 0.9 nm and 2.0 nm. A thickness range between 0.9 nm and 2.0 nm may be sufficiently thin to provide perpendicular magnetic anisotropy required to fabricate a perpendicular MTJ.

Figure 4A:
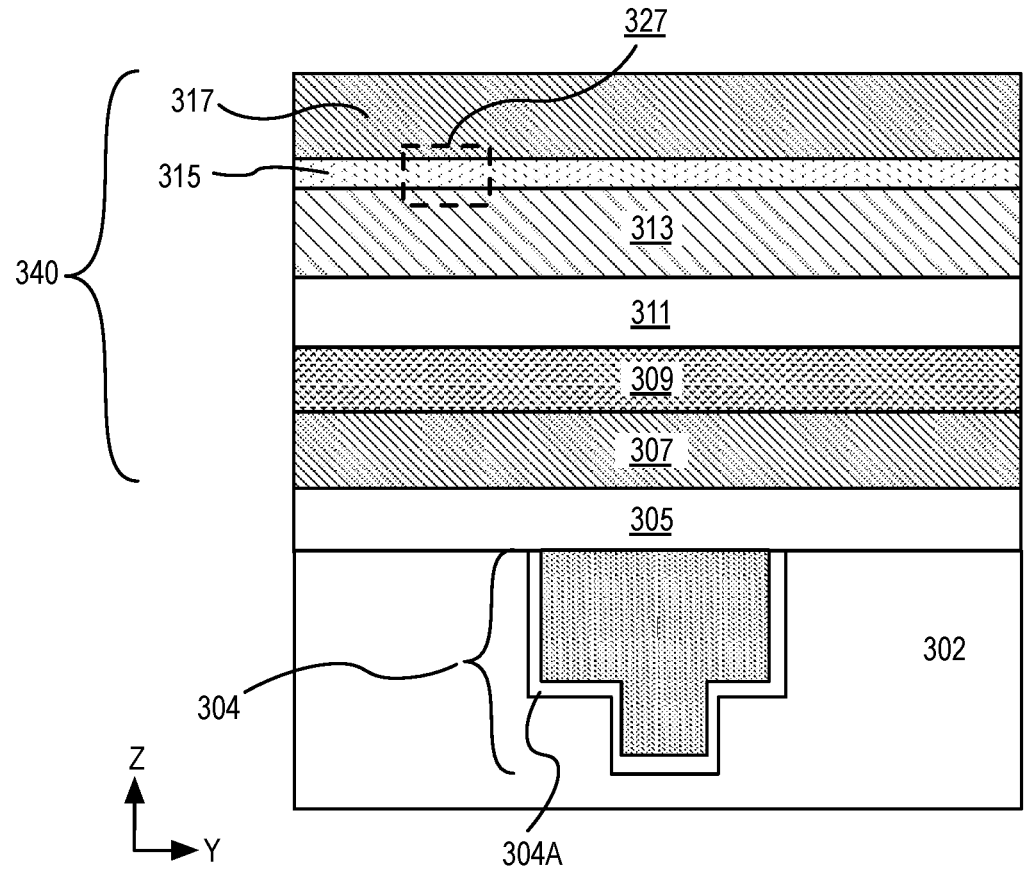
FIG. 4A illustrates a cross-sectional view of the structure in FIG. 3B following the deposition of a coupling layer on the first free magnetic layer, followed by the formation of a second magnetic layer on the coupling layer.

FIG. 4A illustrates a cross-sectional view of the structure in FIG. 3B following the deposition of a coupling layer 315 on the free magnetic layer 313, followed by the formation of a second free magnetic layer 317 on the coupling layer 315. In an embodiment, the coupling layer 315 includes a transition metal and has a thickness no more 0.1 nm. Forming the coupling layer 315 includes depositing a transition metal including at least one of tungsten, hafnium, tantalum or molybdenum. The coupling layer 315 may be deposited by a physical vapor deposition (PVD) process. In some embodiments, the PVD process involves a sputter depositing the material of the coupling layer 315. While deposition energy and time duration of sputter deposition process may be controlled, in some examples, sputter depositing the coupling layer 315 intermixes the transition metal with constituents in at least an upper portion of the free magnetic layer 313. It is to be appreciated that a substantial portion of the transition metal adheres to an upper surface of the free magnetic layer 313. In some embodiments, a sputter process involving deposition of a 0.1 nm coupling layer forms discontinuities in the coupling layer 315 as illustrated in the enhanced cross-sectional illustration of FIG. 4B. The enhanced cross-sectional illustration represents a portion 327 of the free magnetic layer 313, coupling layer 315 and the free magnetic layer 317.

An interface between the coupling layer 315 and the first magnetic layer 313 provides interfacial anisotropy contribution to the overall perpendicular magnetic anisotropy of the first free magnetic layer 313, in spite of discontinuities in the coupling layer 315. An interface between the coupling layer 315 and the free magnetic layer 313 provides interfacial anisotropy contribution to the overall perpendicular magnetic anisotropy of the free magnetic layer 313, in spite of discontinuities in the coupling layer 315.

Figure 4B:
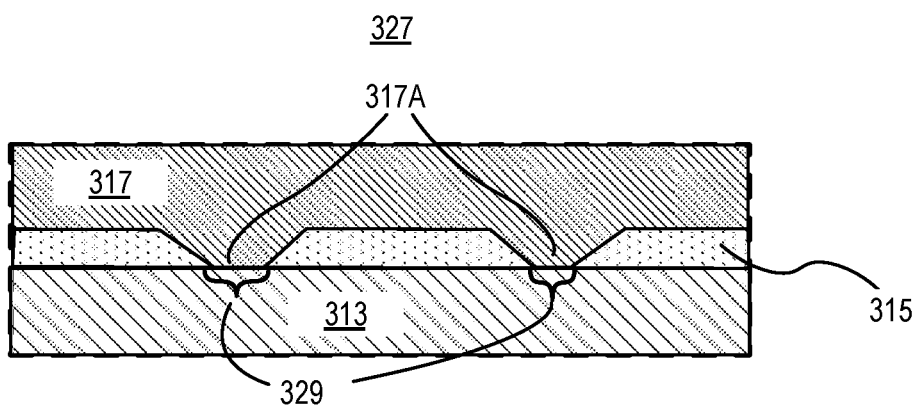
FIG. 4B illustrates an enhanced cross-sectional view of discontinuities in the coupling layer.

In embodiments, where there are discontinuities 329 in the coupling layer 315, portions 317A of the free magnetic layer 317 may be directly on portions of the free magnetic layer 313 as illustrated in FIG. 4B.

Referring again to FIG. 4A, in some examples, the free magnetic layer 317 includes a material that is the same or substantially the same as the material of the free magnet 108. In an embodiment, formation of the free magnetic layer 317 may involve a sputter deposition process, such as a sputter deposition of a layer of CoFeB. In such an embodiment, the sputter deposition process intermixes the CoFeB with the transition metal of coupling layer 315.

Figure 5A:
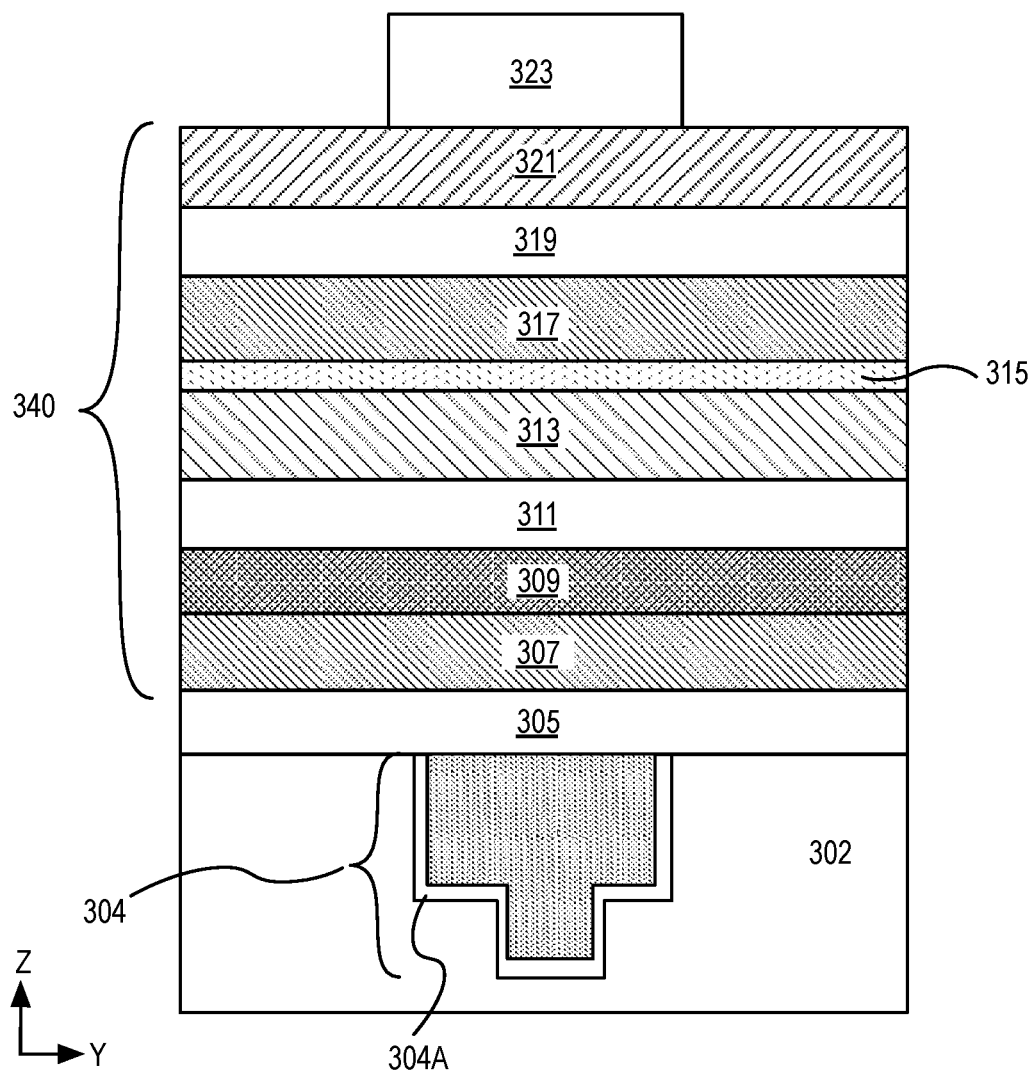
FIG. 5A illustrates a cross-sectional view of the structure in FIG. 4A following the formation of capping layer on the second free magnetic layer, formation of a conductive layer on the capping layer, followed by the formation of a mask on the conductive layer.

FIG. 5A illustrates a cross-sectional view of the structure in FIG. 4A following the formation remaining layers of a pMTJ material layer stack 340. In an embodiment, the capping layer 319 is deposited using a reactive sputter deposition technique and includes a material such as the material of the cap 114. In an embodiment, the capping layer 319 and the tunnel barrier layer 311 both include magnesium and oxygen. In some such embodiments, the capping layer 319 includes a layer of magnesium and oxygen that functions as a conductive oxide rather than as a tunnel barrier. In an embodiment, the capping layer 319 is deposited to a thickness of at least 1.0 nm. A thickness of at least 1.0 nm may advantageously counteract a nominal reduction in thermal stability of a pMTJ, that includes a 0.1 nm thin coupling layer in a free magnet structure.

In an embodiment, the conductive layer 321 is blanket deposited on the surface of the capping layer 319. In an embodiment, the conductive layer 321 includes a material suitable to provide a hardmask for etching the pMTJ material layer stack 340. In an embodiment, the conductive layer 321 includes one or more layers of material such as Ta, TaN or TiN. In an embodiment, the thickness of the conductive layer 321 ranges from 30 nm to 70 nm.

In an embodiment, after all the layers in the pMTJ material layer stack 340 are deposited, an anneal is performed. In an embodiment, the anneal process enables formation of a crystalline MgO—tunnel barrier layer 311. In an embodiment, the anneal is performed immediately post deposition but before forming the mask on the conductive layer 321. A post-deposition anneal of the pMTJ material layer stack 340 is carried out in a furnace at a temperature between 300-350 degrees Celsius in a forming gas environment. In an embodiment, the forming gas includes a mixture of $H_2$ and $N_2$ gas. In an embodiment, the annealing process promotes solid phase epitaxy of the fixed magnetic layer 309 to follow a crystalline template of the tunnel barrier layer 310 (e.g., MgO) that is directly above the fixed magnetic layer 309. In an embodiment, the anneal also promotes solid phase epitaxy of the free magnetic layer 313 to follow a crystalline template of the tunnel barrier layer 310 (e.g., MgO) that is directly below the free magnetic layer 313, in the illustrative embodiment. <001> Lattice matching between the tunnel barrier layer 311 and the fixed magnetic layer 309 and <001> lattice matching between the tunnel barrier layer 311 and the free magnetic layer 313 enables a TMR ratio of at least 90% to be obtained in the pMTJ material layer stack 340.

After an anneal, a mask 323 is formed on the conductive layer 321. In an embodiment, the mask 323 defines a shape and size of a memory device and a location where the memory device is to be subsequently formed with respect the conductive interconnect 304. In some embodiments, the mask 323 is formed by a lithographic process. In other embodiments, the mask 323 includes a dielectric material that has been patterned.

Figure 5B:
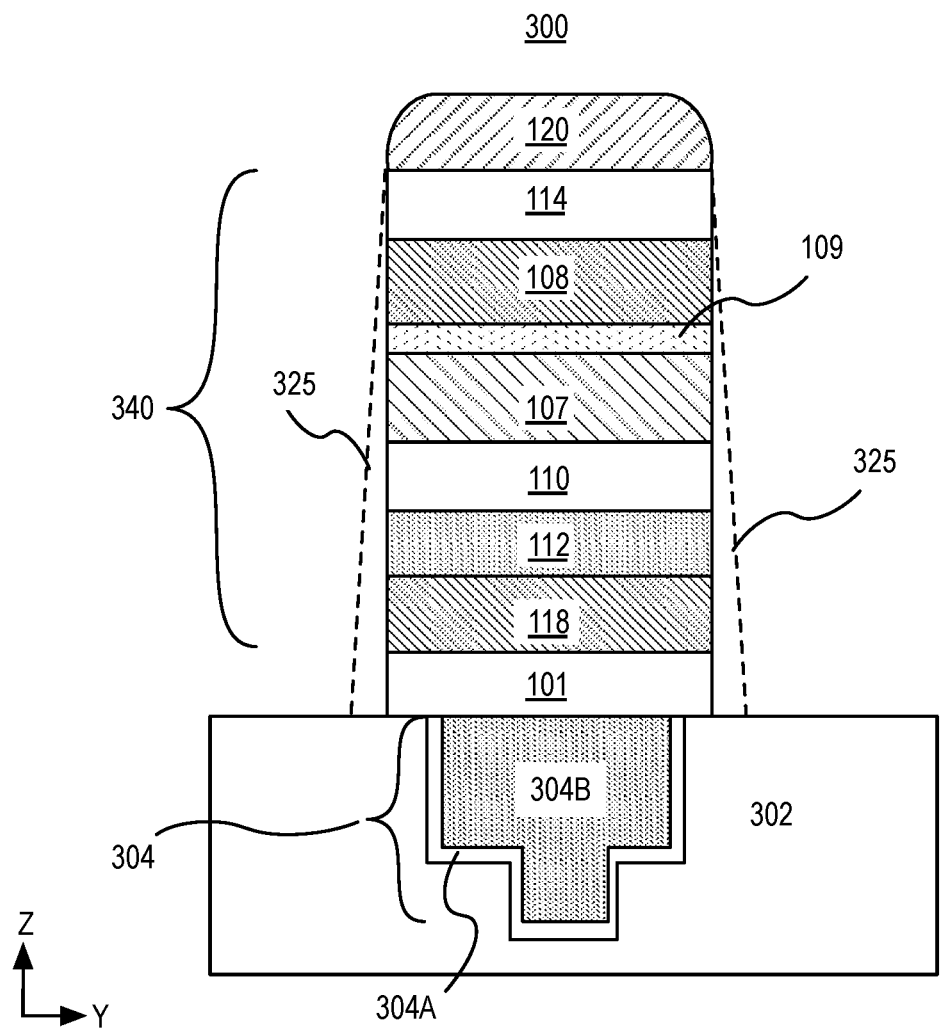
FIG. 5B illustrates a cross-sectional view of the structure in FIG. 4A following the patterning of the conductive layer and the pMTJ material layer stack to form a pMTJ device.

FIG. 5B illustrates a cross-sectional view of the structure in FIG. 4A following the patterning of the conductive layer 321 and the pMTJ material layer stack 340. In an embodiment, the patterning process includes etching the conductive layer 321 by a plasma etch process to form a top electrode 120. In an embodiment, plasma etch process possesses sufficient ion energy and chemical reactivity to render vertical etched sidewalls of the top electrode 120.

In an embodiment, the plasma etch process is then continued to pattern the layers of the pMTJ material layer stack 340 to form a memory device 300. The plasma etch process etches the various layers in the pMTJ material layer stack 340 to form the cap 114, the free magnet 108, the coupling layer 109, the free magnet 107, the tunnel barrier 110, the fixed magnet 112, and the SAF structure 118. The plasma etch process is continued to pattern and form a bottom electrode 101. The plasma etch process exposes the underlying dielectric layer 302. In some embodiments, depending on the etch parameters, the memory device 300. may have sidewalls that are tapered as indicated by the dashed lines 325. In the illustrative embodiment, the memory device 300 constitutes a perpendicular magnetic tunnel junction (pMTJ) memory device 100 or a pMTJ memory device 300.

Figure 5C:
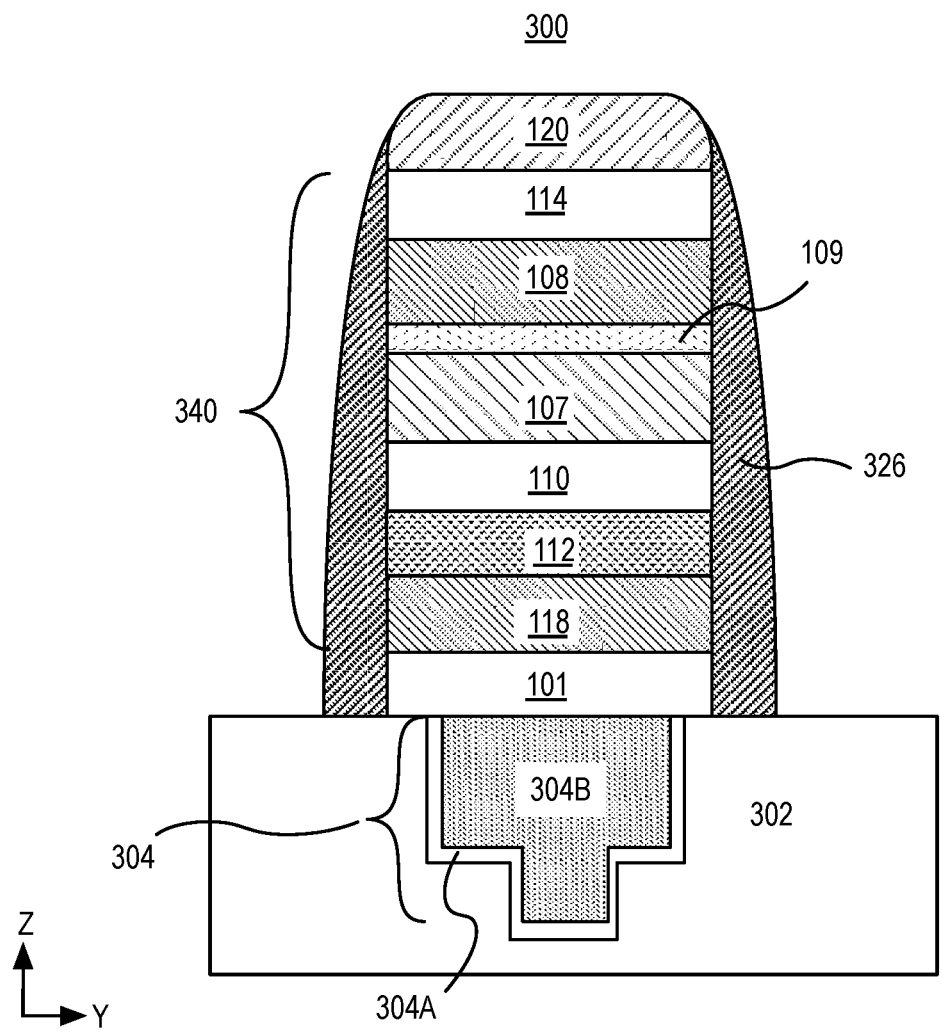
FIG. 5C illustrates a cross-sectional view of the structure in FIG. 5B following the formation of a dielectric spacer adjacent to the pMTJ.

FIG. 5C illustrates a cross-sectional view of the structure in FIG. 5B following the formation of a dielectric spacer 326 adjacent to the memory device 300. In an embodiment, a dielectric spacer layer is deposited on the memory device 300 and on the uppermost surface of the dielectric layer 102. In an embodiment, the dielectric spacer layer is deposited without a vacuum break following the plasma etch process to prevent oxidation of magnetic layers in the pMTJ 104. In an embodiment, the dielectric spacer layer includes a material such as, but not limited to, silicon nitride, carbon doped silicon nitride or silicon carbide. In an embodiment, the dielectric spacer layer includes an insulator layer that does not have oxygen to minimize oxidation of the magnetic layers 112, 107 and 108. In an embodiment, the dielectric spacer layer is etched by a plasma etch process forming dielectric spacer 326 on sidewalls of the memory device 300.

Figure 6:
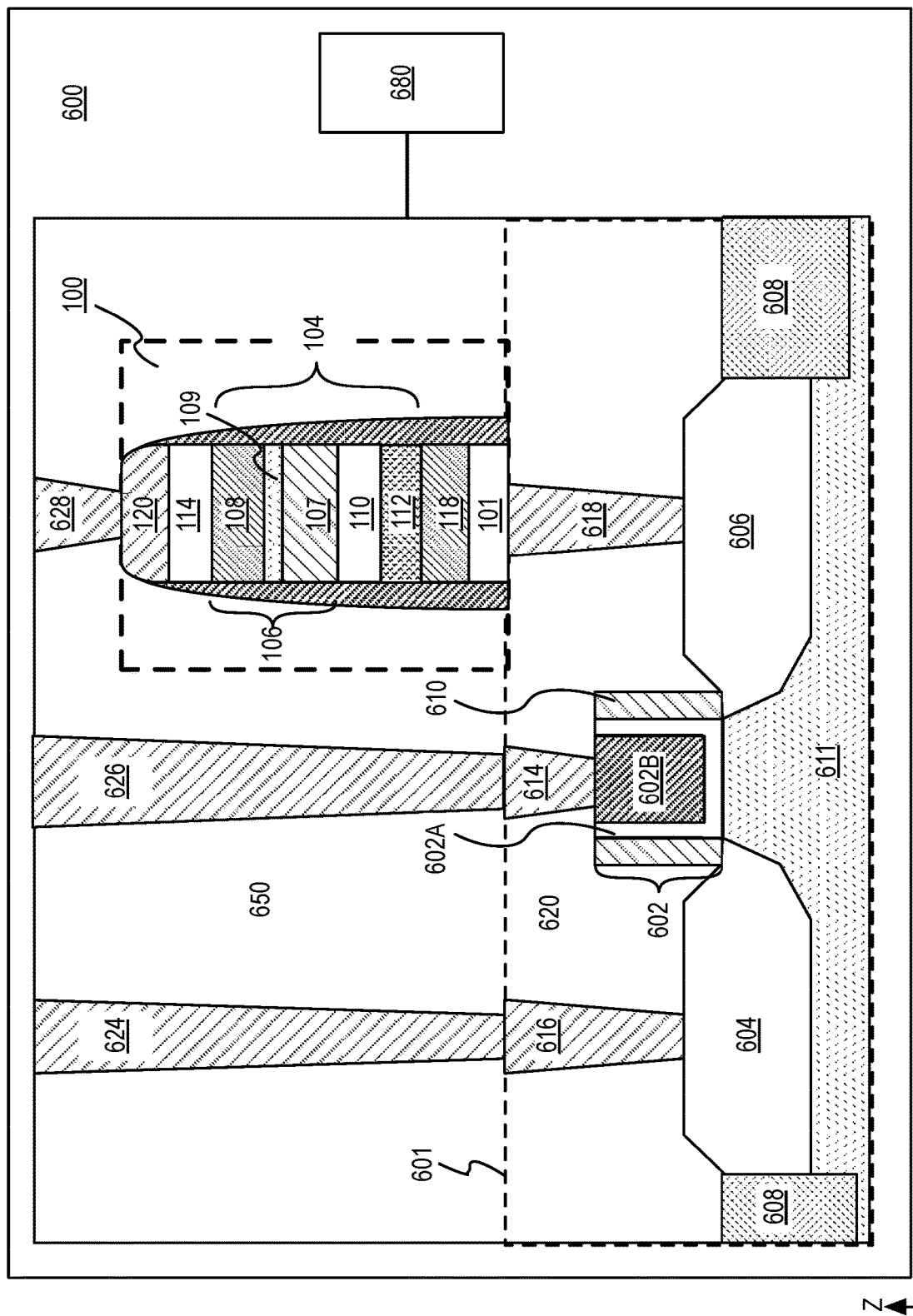
FIG. 6 illustrates a cross-sectional view of a SOT memory device coupled having one terminal coupled to a first transistor, a second terminal coupled to a second transistor, and a third terminal coupled to a bit line.

FIG. 6 illustrates a system 600 including a power supply 680 connected to a memory device 100 coupled with a transistor 601. In an embodiment, a memory device such as the memory device 300 includes a pMTJ 104 on a bottom electrode 101, described in association with FIGS. 1A-1E.

In an embodiment, the transistor 601 has a source region 604, a drain region 606 and a gate 602. The transistor 601 further includes a gate contact 614 above and electrically coupled to the gate 602, a source contact 616 above and electrically coupled to the source region 604, and a drain contact 618 above and electrically coupled to the drain region 606 as is illustrated in FIG. 6. The memory device 100 includes a bottom electrode 101, a top electrode 120, and a pMTJ 104 between the bottom electrode 101 and the top electrode 120. The pMTJ 104 includes a fixed magnet 112 above the bottom electrode 101, a free magnet structure 106 above the fixed magnet 112 and a tunnel barrier 110 between the fixed magnet 112 and the free magnet structure 106. The free magnet structure 106 includes a first free magnet 107 on the tunnel barrier 110, and a second free magnet 108 on the first free magnet 107, wherein at least a portion of the free magnet 107 proximal to an interface with the free magnet 108 includes a transition metal. In some embodiments, the transition metal includes at least one of tungsten, hafnium, tantalum or molybdenum. The memory device 100 further includes the cap 114 between the top electrode 120 and the free magnet structure 106. In the illustrative embodiment, the memory device 100 further includes a SAF structure 118 above the bottom electrode 101.

In the illustrative embodiment, the memory device 100 is electrically coupled with the drain contact 618 of transistor 601. An MTJ contact 628 is on and electrically coupled with the top electrode 120 of the MTJ 104.

In an embodiment, the underlying substrate 611 represents a surface used to manufacture integrated circuits. Suitable substrate 611 includes a material such as single crystal silicon, polycrystalline silicon and silicon on insulator (SOI), as well as substrates formed of other semiconductor materials. In some embodiments, the substrate 611 is the same as or substantially the same as the substrate 150. The substrate 611 may also include semiconductor materials, metals, dielectrics, dopants, and other materials commonly found in semiconductor substrates.

In an embodiment, the access transistor 601 associated with substrate 611 are metal-oxide-semiconductor field-effect transistors (MOSFET or simply MOS transistors), fabricated on the substrate 611. In various implementations of the invention, the access transistor 601 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the transistor 601 of substrate 611 includes a gate 602. In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 601 of substrate 611 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 602B may consist of one or more U-shaped metal layers formed atop one or more planar, non-U-shaped layers.

In some implementations of the invention, a pair of sidewall spacers 610 are on opposing sides of the gate 602 that bracket the gate stack. The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 611 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606. In the illustrative embodiment, an isolation 608 is adjacent to the source region 604, drain region 606 and portions of the substrate 611.

In an embodiment, a dielectric layer 620 is adjacent to the source contact 616, the drain contact 618 and the gate contact 614. In the illustrative embodiment, a source metallization structure 624 is coupled with the source contact 616 and a gate metallization structure 626 is coupled with the gate contact 614. In the illustrated embodiment, a dielectric layer 650 is adjacent to the gate metallization structure 626, source metallization structure 624, memory device 100 and MTJ contact 628.

In an embodiment, the source contact 616, the drain contact 618, gate contact 614, gate metallization structure 626, source metallization structure 624 and MTJ contact 628 each include a multi-layer stack. In an embodiment, the multi-layer stack includes two or more distinct layers of metal such as a layer of Ti, Ru or Al and a conductive cap on the layer of metal. The conductive cap may include a material such as Co, W or Cu.

The isolation 608 and dielectric layers 620 and 650 may include any material that has sufficient dielectric strength to provide electrical isolation such as, but not, limited silicon dioxide, silicon nitride, silicon oxynitride, carbon doped nitride and carbon doped oxide.

Figure 7:
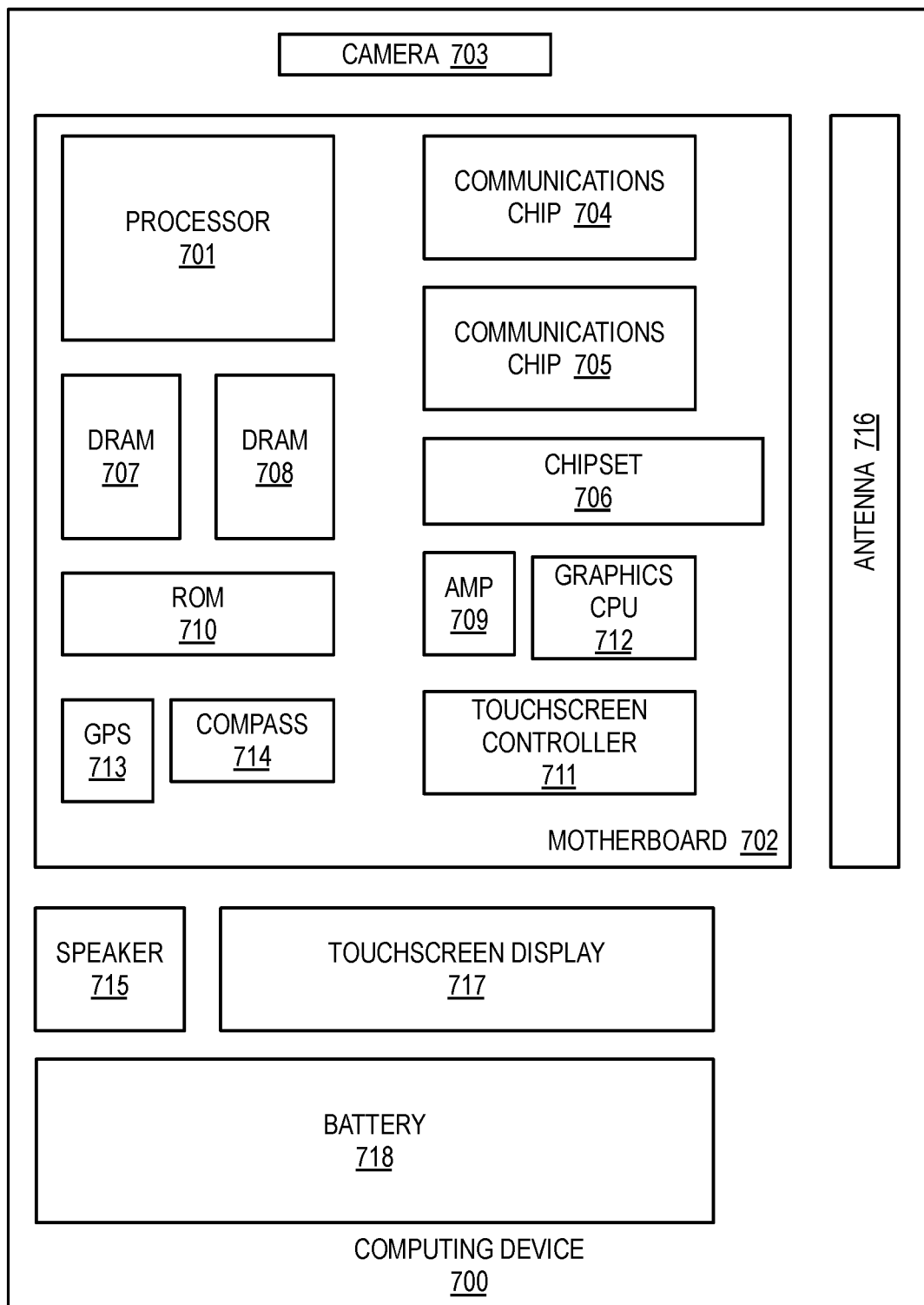
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communication chip 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.6 family), WiMAX (IEEE 802.6 family), IEEE 802.7, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 704 and 705. For instance, a first communication chip 705 may be dedicated to shorter range wireless communications such as Wi-Fi and Bluetooth and a second communication chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more memory devices, such as SOT memory device 100, described in association with FIGS. 1A, 1B, 1C, 1D, and 1E in accordance with embodiments of the present disclosure. The term "processor" may refer to any device or portion of a device that processes electronic data from registers and/or memory to transform that electronic data into other electronic data that may be stored in registers and/or memory.

Communications chip 705 also includes an integrated circuit die packaged within communications chip 705. In another embodiment, the integrated circuit die of communication chips 704 and 705 include a memory array with memory cells including at least one memory device such as a memory device 100 including a MTJ 104.

In various examples, one or more communication chips 704 and 705 may also be physically and/or electrically coupled to the motherboard 702. In further implementations, communications chip 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells including one or more memory devices, such as a memory device 100, including a pMTJ 104 on a conductive layer including Ru and W, built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, IOT device in automotive applications or a digital video recorder. In further implementations, the computing device 700 may be any other electronic device that processes data.

Figure 8:
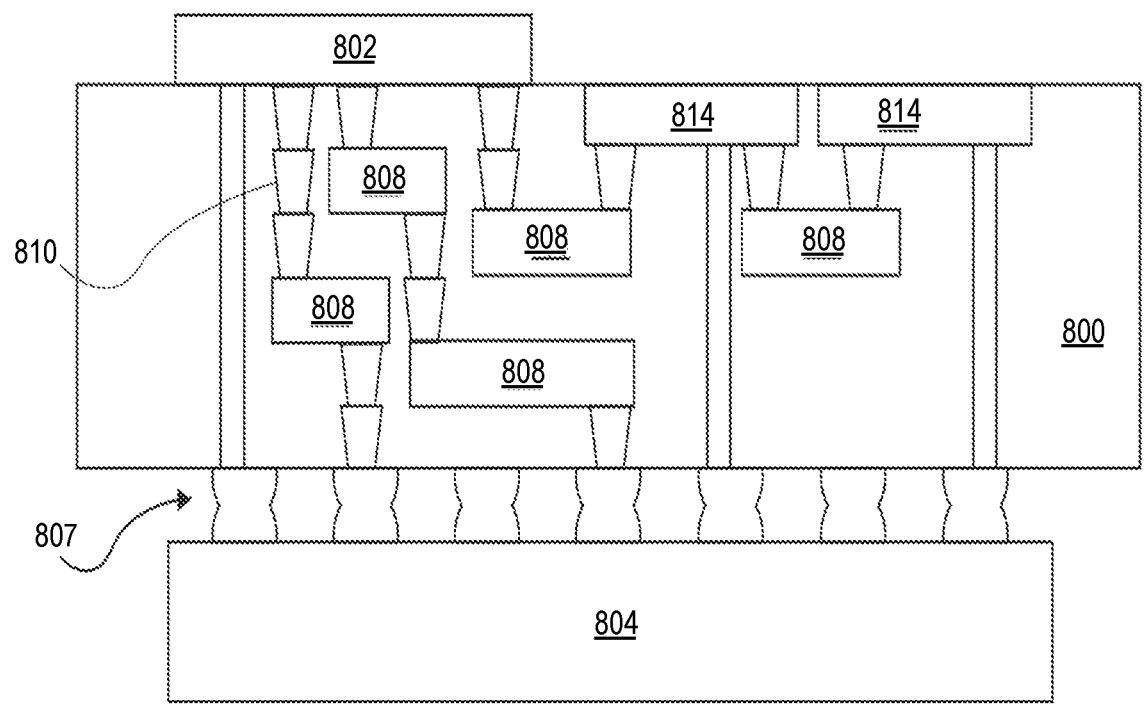
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 810. The integrated circuit (IC)

structure 800 may further include embedded devices 814, including both passive and active devices. Such devices include, but are not limited to, capacitors, decoupling capacitors, resistors, inductors, fuses, diodes, transformers, device structure including transistors, such as a transistor 601 (described in association with FIG. 6, not shown in FIG. 8) coupled with a with one at least one memory device such as the memory device 100 where at least a portion of the free magnet 107 proximal to an interface with the free magnet 108 includes a transition metal. The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a perpendicular magnetic tunnel junction memory device such as the pMTJ device 100 and 300. The pMTJ devices 100 and 300 may be used in embedded non-volatile memory applications.

Thus, embodiments of the present disclosure include magnetic memory devices and methods to form the same.

In a first example, the memory device, includes a bottom electrode, a top electrode and a magnetic tunnel junction (MTJ) between the bottom electrode and the top electrode. The MTJ includes a fixed magnet, a free magnet structure includes, a first free magnet, a second free magnet adjacent the first free magnet, wherein at least a portion of the first free magnet proximal to an interface with the second free magnet comprises a transition metal and a tunnel barrier between the fixed magnet and the free magnet structure.

In second examples, for any of first examples, the transition metal comprises at least one of tungsten, hafnium, tantalum or molybdenum.

In third examples, for any of the first through second examples, the memory device further includes a coupling layer between the first free magnet and the second free magnet, wherein the coupling layer is discontinuous, has a thickness no more than 0.1 nm and comprises the transition metal.

In fourth examples, for any of the first through third examples, at least a portion of the first free magnet is in direct contact with the second free magnet, in at least one discontinuity of the coupling layer.

In fifth examples, for any of the first through fourth examples, the first free magnet has a first perpendicular magnetic anisotropy and the second free magnet has a second perpendicular magnetic anisotropy.

In sixth examples, for any of the fifth examples, the first perpendicular magnetic anisotropy is greater than the second perpendicular magnetic anisotropy.

In seventh examples, for any of the first through sixth examples, the first free magnet has a thickness that is greater than a thickness of the second free magnet and wherein the free magnet structure has a combined total thickness that is less than 3 nm.

In eighth examples, for any of the first through seventh examples, the first free magnet comprises cobalt, iron and boron and the second free magnet comprises cobalt, iron and boron.

In ninth examples, for any of the first through eighth examples, the memory device further includes a cap layer includes metal and oxygen between the free magnet structure and the top electrode, and wherein the cap layer is on the side of the free magnet structure that is opposite to the tunnel barrier.

In tenth examples, for any of the ninth example, the cap layer has a thickness of at least 1.5 nm.

In eleventh examples, a method of fabricating a memory device, includes forming a bottom electrode layer, forming a material layer stack on the bottom electrode layer. Forming the material layer stack includes forming a fixed magnetic layer above the bottom electrode layer, forming a tunnel barrier layer on fixed magnetic layer, forming a first free magnetic layer on the tunnel barrier layer, forming a coupling layer on the first free magnetic layer, wherein the coupling layer includes a transition metal and has a thickness no more 0.1 nm, forming a second free magnetic layer on the coupling layer, forming a top electrode on the material layer stack and etching the material layer stack to form a memory device.

In twelfth examples, for any of the eleventh example, forming the coupling layer includes depositing at least one of tungsten, hafnium, tantalum or molybdenum.

In thirteenth examples, for any of the eleventh through the twelfth examples, depositing the coupling layer includes sputter depositing the coupling layer.

In a fourteenth example, for any of the thirteenth examples, sputter depositing the coupling layer intermixes the transition metal with constituents in at least an upper portion of the first free magnetic layer.

In a fifteenth example, for any of the thirteenth examples, sputter depositing a 0.1 nm coupling layer forms discontinuities in the coupling layer.

In sixteenth examples, for any of the eleventh through the fifteenth examples, forming the second free magnetic layer includes sputter depositing CoFeB.

In seventeenth examples, for any of the sixteenth example; the sputter depositing intermixes the CoFeB with the transition metal of coupling layer.

In eighteenth examples, an apparatus includes a transistor above a substrate. The transistor includes a drain contact coupled to a drain, a source contact coupled to a source, a gate contact coupled to a gate and a memory device coupled with the drain contact, includes a top electrode, a bottom electrode and a magnetic tunnel junction (MTJ) between the top electrode and the bottom electrode. The MTJ includes a fixed magnet, a free magnet structure including a first free magnet and a second free magnet adjacent the first free magnet, where at least a portion of the first free magnet proximal to an interface with the second free magnet includes a transition metal and a tunnel barrier between the fixed magnet and the free magnet structure.

In nineteenth examples, for any of the eighteenth example, the apparatus further includes a power supply coupled to the transistor.

In a twentieth example, for any of the eighteenth through nineteenth examples, the fixed magnet is above the drain contact, the tunnel barrier is above the fixed magnet and the free magnet structure is above the tunnel barrier.

What is claimed is:

1. A memory device, comprising:
   a first electrode;
   a second electrode; and
   a magnetic tunnel junction (MTJ) between the first electrode and the second electrode, the MTJ comprising:
      a fixed magnet;
      a free magnet structure comprising;
         a first free magnet with a first perpendicular magnetic anisotropy; and
         a second free magnet adjacent the first free magnet with a coupling layer therebetween, wherein at least a portion of the first free magnet is in direct contact with the second free magnet within at least one discontinuity of the coupling layer, wherein the coupling layer and at least a portion of the first free magnet proximal to the second free magnet comprises at least one of tungsten, hafnium, tantalum or molybdenum, and wherein the second free magnet has a second perpendicular magnetic anisotropy less than the first perpendicular magnetic anisotropy; and
         a tunnel barrier between the fixed magnet and the free magnet structure.

2. The memory device of claim 1, wherein the first free magnet has a thickness that is greater than a thickness of the second free magnet and wherein the free magnet structure has a combined total thickness that is less than 3 nm.

3. The memory device of claim 1, wherein the first free magnet comprises cobalt, iron and boron and the second free magnet comprises cobalt, iron and boron.

4. The memory device of claim 1, further comprising a cap layer having a thickness of at least 1.5 nm and comprising metal and oxygen between the free magnet structure and the second electrode, and wherein the cap layer is on the side of the free magnet structure that is opposite to the tunnel barrier.

5. A method of fabricating a memory device, comprising:
   forming a bottom electrode layer;
   forming a material layer stack on the bottom electrode layer, the forming comprising:
      forming a fixed magnetic layer above the bottom electrode layer;
      forming a tunnel barrier layer on fixed magnetic layer;
      forming a first free magnetic layer on the tunnel barrier layer;
      intermixing constituents in at least an upper portion of the first free magnetic layer with at least one of tungsten, hafnium, tantalum or molybdenum by sputter depositing, on the first free magnetic layer, the at least one of tungsten, hafnium, tantalum or molybdenum to a thickness of no more than 0.1 nm;
      forming a second free magnetic layer over the first free magnetic layer;
   forming a top electrode on the material layer stack; and
   etching the material layer stack to form a memory device.

6. The method of claim 5, wherein sputter depositing the at least one of tungsten, hafnium, tantalum or molybdenum forms a coupling layer between at least some portions of the first and second free magnetic layers.

7. The method of claim 6, wherein the sputter depositing leaves discontinuities in the coupling layer and portions of the second free magnetic layer within the discontinuities are in direct contact with the first free magnetic layer.

8. The method of claim 5, wherein forming the second free magnetic layer comprises sputter depositing CoFeB.

9. The method of claim 8, wherein the sputter depositing intermixes the CoFeB with the at least one of tungsten, hafnium, tantalum or molybdenum.

10. An apparatus comprising:
    a transistor above a substrate, the transistor comprising:
       a drain contact coupled to a drain;
       a source contact coupled to a source;
       a gate contact coupled to a gate;
    the memory device of claim 1 coupled with the drain contact.

11. The apparatus of claim 10, further comprising a power supply coupled to the transistor.

12. The apparatus of claim 10, wherein the fixed magnet is above the drain contact, the tunnel barrier is above the fixed magnet and the free magnet structure is above the tunnel barrier.

* * * * *